US008933622B2

(12) United States Patent
Kawami et al.

(10) Patent No.: US 8,933,622 B2
(45) Date of Patent: Jan. 13, 2015

(54) ORGANIC ELECTROLUMINESCENCE ELEMENT

(75) Inventors: Shin Kawami, Tsurugashima (JP); Taishi Tsuji, Tsurugashima (JP); Hideki Sato, Yokohama (JP); Masayoshi Yabe, Yokohama (JP)

(73) Assignees: Pioneer Corporation, Tokyo (JP); Mitsubishi Chemical Corporation, Tokyo (JP)

(*) Notice: Subject to any disclaimer, the term of this patent is extended or adjusted under 35 U.S.C. 154(b) by 435 days.

(21) Appl. No.: 11/915,348

(22) PCT Filed: May 23, 2006

(86) PCT No.: PCT/JP2006/310254
§ 371 (c)(1),
(2), (4) Date: Nov. 23, 2007

(87) PCT Pub. No.: WO2006/126542
PCT Pub. Date: Nov. 30, 2006

(65) Prior Publication Data
US 2009/0134779 A1    May 28, 2009

(30) Foreign Application Priority Data

May 24, 2005    (JP) .................................. 2005-150747

(51) Int. Cl.
*H01L 51/54* (2006.01)
*H01L 51/50* (2006.01)
*H01L 51/00* (2006.01)

(52) U.S. Cl.
CPC ........ *H01L 51/5016* (2013.01); *H01L 51/0072* (2013.01); *H01L 51/5004* (2013.01);
(Continued)

(58) Field of Classification Search
CPC ............ H01L 51/0067; H01L 51/0072; H01L 51/5012; H01L 51/5016
USPC .......................................... 313/504; 428/690
See application file for complete search history.

(56) References Cited

U.S. PATENT DOCUMENTS 6,274,979 B1 *  8/2001  Celii et al. .................... 313/506
7,829,204 B2   11/2010  Iwakuma
(Continued)

FOREIGN PATENT DOCUMENTS

CN    1918947    2/2007
CN    1934213    3/2007
(Continued)

OTHER PUBLICATIONS

Funahashi et al., Machine translation of JP 2004-171828A, Jun. 17, 2004.*

(Continued)

*Primary Examiner* — Nimeshkumar Patel
*Assistant Examiner* — Steven Horikoshi
(74) *Attorney, Agent, or Firm* — Ladas & Parry, LLP

(57) ABSTRACT

Disclosed is an organic electroluminescent device having a longer drive life. Specifically disclosed is an organic electroluminescent device (100) comprising an organic material layer (16), which is composed of a hole transporting layer (164), a light-emitting layer (166) and an electron transporting layer (167), between a pair of electrodes, namely a cathode (18) and an anode (12). The light-emitting layer (166) (having a film thickness (dM) of 5-3000 nm) contains a luminescent dye and a host material. The first oxidation potential (ED+) of the luminescent dye is lower than the first oxidation potential (EH+) of the host material, while the first reduction potential (ED−) of the luminescent dye is lower than the first reduction potential (EH−) of the host material. The film thickness (dE: 5-3000 nm) of the electron transporting layer (167) and the film thickness (dH: 5-3000 nm) of the hole transporting layer (164) satisfy the following relation: dH≤dE.

4 Claims, 1 Drawing Sheet

(52) U.S. Cl.
CPC ............ *H01L51/5048* (2013.01); *H01L 51/005* (2013.01); *H01L 51/008* (2013.01); *H01L 51/0081* (2013.01); *H01L 51/0085* (2013.01); *H01L 51/5088* (2013.01); *H01L 2251/558* (2013.01)
USPC ....................................................... 313/504

(56) References Cited

U.S. PATENT DOCUMENTS

| | | | |
|---|---|---|---|
| 8,168,307 B2 * | 5/2012 | Iida et al. | 428/690 |
| 8,178,215 B2 * | 5/2012 | Yabe et al. | 428/690 |
| 8,592,052 B2 * | 11/2013 | Tsuji et al. | 428/690 |
| 2003/0099864 A1 * | 5/2003 | Kwon et al. | 428/690 |
| 2003/0175553 A1 | 9/2003 | Thompson | |
| 2004/0001968 A1 | 1/2004 | Hatwar et al. | 6/20 |
| 2004/0086745 A1 * | 5/2004 | Iwakuma et al. | 428/690 |
| 2004/0100189 A1 | 5/2004 | Adachi | |
| 2004/0110031 A1 | 6/2004 | Fukuda | |
| 2004/0209115 A1 | 10/2004 | Thompson | |
| 2004/0265630 A1 * | 12/2004 | Suh et al. | 428/690 |
| 2005/0127823 A1 | 6/2005 | Iwakuma | |
| 2005/0158578 A1 | 7/2005 | Iwakuma | |
| 2005/0249976 A1 | 11/2005 | Iwakuma | |
| 2006/0186796 A1 | 8/2006 | Yabe | |
| 2007/0159083 A1 | 7/2007 | Matsuura | |
| 2009/0066223 A1 | 3/2009 | Yabe et al. | |
| 2009/0184625 A1 | 7/2009 | Tsuji | |
| 2009/0236973 A1 | 9/2009 | Yabe | |

FOREIGN PATENT DOCUMENTS

| | | |
|---|---|---|
| EP | 0 517 542 | 12/1992 |
| EP | 1 486 550 | 12/2004 |
| EP | 1 489 155 | 12/2004 |
| EP | 1672961 | 6/2006 |
| EP | 1 718 121 | 11/2006 |
| EP | 1 724 323 | 11/2006 |
| EP | 1 829 871 A1 | 9/2007 |
| EP | 1857521 | 11/2007 |
| EP | 1885008 | 2/2008 |
| EP | 1887640 | 2/2008 |
| JP | 04-172357 | 6/1992 |
| JP | 6 1972 | 1/1994 |
| JP | 08-067872 | 3/1996 |
| JP | 11-251067 | 9/1999 |
| JP | 2000-169448 | 6/2000 |
| JP | 2001-313178 | 11/2001 |
| JP | 2002-043059 | 2/2002 |
| JP | 2002-056985 | 2/2002 |
| JP | 2002056985 | 2/2002 |
| JP | 2003-022893 | 1/2003 |
| JP | 2003-031365 | 1/2003 |
| JP | 2003-282270 A | 10/2003 |
| JP | 2004-071380 | 3/2004 |
| JP | 2004-171808 | 6/2004 |
| JP | 2004-171828 | 6/2004 |
| JP | 2004-253298 | 9/2004 |
| JP | 2004 273190 | 9/2004 |
| JP | 2004-311413 | 11/2004 |
| JP | 2005-060382 | 3/2005 |
| JP | 2005-085658 | 3/2005 |
| JP | 2005-116203 | 4/2005 |
| JP | 2005-203293 | 7/2005 |
| JP | 2005-268199 | 9/2005 |
| JP | 2000-186066 | 7/2010 |
| KR | 10-2004-0094842 | 11/2004 |
| TW | 200304937 A | 10/2003 |
| TW | 200305353 A | 10/2003 |
| WO | WO 03/078541 | 9/2003 |
| WO | WO 03078541 A1 * | 9/2003 |
| WO | 03/080760 | 10/2003 |
| WO | 03/080761 | 10/2003 |
| WO | 2005/022962 | 3/2005 |
| WO | 2005/057987 | 6/2005 |
| WO | 2005/076669 | 8/2005 |
| WO | 2005/079118 | 8/2005 |
| WO | 2005/085387 | 9/2005 |
| WO | 2006/062062 A1 | 6/2006 |
| WO | WO2006/095539 A1 | 9/2006 |

OTHER PUBLICATIONS

Machine translation of Iwakauma et al. (WO 03/078541), listed as JP 03/078541,A1 (2003).*
U.S. Appl. No. 12/096,844.*
U.S. Appl. No. 11/816,672.*
"Ultrathin Films for Optics and Electronics," Chunhui Huang, Peking University Press, 1$^{st}$ edition published on Mar. 31, 2001, pp. 286-287.
Supervised by Junji Shiroto, "Yuki EL Zairyo to Display", Second edition, Kabushiki Kaisha CMC, Apr. 20, 2001, pp. 93 to 94.
Kaisha, K., "Yuki EL Zairyo to Display," supervised by Junji Shiroto, Second Edition, CMC, pp. 93-94 (Apr. 2001).
Office Action issued in the corresponding Japanese Application No. 2007-517841 and mailed on Aug. 10, 2010, with an English-language translation prepared by Applicant's Japanese counsel.
Office Action for corresponding JP 2007-517841 issued Mar. 1, 2011.
English Translation of Office Action for corresponding JP 2007-517841 issued Mar. 1, 2011.
Search Report dated Sep. 13, 2012 for related Taiwanese Patent App. No. 095118392, and its English translation.
Office Action for EP06746738.1 issued on Nov. 21, 2012.
Supplemental European Search Report for related Application EP 06746738 mailed Mar. 5, 2012.
PCT International Search Report mailed on Jul. 18, 2006 from corresponding PCT/JP2006/310254 and its English translation.
PCT Chapter I International Preliminary Report on Patentability dated Nov. 29, 2007 (with Written Opinion) from corresponding PCT/JP2006/310254 and its English translation.
Baldo, et al.,"Very High-efficiency Green Organic Light-emitting Devices Based on Electrophosphorescence", Applied Physics Letters, vol. 75, No. 1, pp. 4-6, 1999.
Holmes, R.J. et al., Applied Physics Letters, vol. 82, No. 15, pp. 2422-2424 (Apr. 14, 2003).
Pei, Jian, et al., "Structural Dependence of the Selectivity of Fluorescent Chemosensors to Mg.sup.2+ form Alkali Earth Metal Ions", Macromolecular: Rapid Communications, XP009118214, vol. 23, No. 1, Jan. 1, 2002, pp. 21-25.
Solomons, G., & Fryhle, C. (2000). Organic Chemistry Seventh Edition. New York, New York: John Wiley & Sons, Inc. pp. 676-691.
Office Action issued Jan. 31, 2012, in Japanese Patent Application No. 2005-350623 filed Dec. 5, 2005.
Office Action issued Mar. 11, 2011, in Korean Patent Application No. 10-2007-7017180.
Office Action issued May 30, 2011, in Korean Patent Application No. 10-2007-7013039, filed Aug. 27, 2007.
Office Action issued Sep. 1, 2011 in Chinese Application No. 200580042418.8 (with English Translation).
Office Action issued Sep. 7, 2011, in Chinese Patent Application No. 200680002950.1 (with partial English-language translation).
Office Action mailed Jan. 17, 2012, in Japanese Patent Application No. 2006-011266, filed Jan. 19, 2006 (with English translation).
From U.S. Appl. No. 12/096,844 (now published as US 2009-0184625), Office Action mailed on Jun. 9, 2011.
From U.S. Appl. No. 12/096,844 (now published as US 2009-0184625), Office Action mailed on Nov. 25, 2011.
From U.S. Appl. No. 12/096,844 (now published as US 2009-0184625), Office Action mailed on Apr. 28, 2014.
From U.S. Appl. No. 11/721,401 (now U.S. Patent No. 8,178,215), Office Action mailed on Mar. 25, 2010.
From U.S. Appl. No. 11/721,401 (now U.S. Patent No. 8,178,215), Office Action mailed on Sep. 17, 2010.
From U.S. Appl. No. 11/721,401 (now U.S. Patent No. 8,178,215), Office Action mailed on Mar. 9, 2011.

(56) References Cited

OTHER PUBLICATIONS

From U.S. Appl. No. 11/721,401 (now U.S. Patent No. 8,178,215), Office Action mailed on Jul. 6, 2011.
From U.S. Appl. No. 11/721,401 (now U.S. Patent No. 8,178,215), Office Action mailed on Oct. 26, 2011.
From U.S. Appl. No. 11/721,401 (now U.S. Patent No. 8,178,215), Office Action mailed on Feb. 3, 2012.
From U.S. Appl. No. 11/814,570 (now U.S. Patent No. 8,168,307), Office Action mailed on Apr. 16, 2010.
From U.S. Appl. No. 11/814,570 (now U.S. Patent No. 8,168,307), Office Action mailed on Sep. 1, 2010.
From U.S. Appl. No. 11/814,570 (now U.S. Patent No. 8,168,307), Office Action mailed on Dec. 21, 2010.
From U.S. Appl. No. 11/814,570 (now U.S. Patent No. 8,168,307), Office Action mailed on Feb. 3, 2011.
From U.S. Appl. No. 11/814,570 (now U.S. Patent No. 8,168,307), Office Action mailed on Aug. 3, 2011.
From U.S. Appl. No. 11/814,570 (now U.S. Patent No. 8,168,307), Office Action mailed Dec. 27, 2011.

* cited by examiner

ORGANIC ELECTROLUMINESCENCE ELEMENT

TECHNICAL FIELD

The present invention relates to an organic electroluminescence (hereinafter referred to as EL) element emitting light on a luminescence layer by injecting electrons and holes, particularly the organic EL element that includes a hole transport layer provided on the anode side of the luminescence layer and an electron transport layer provided on the cathode side of the luminescence layer with respect of between a pair of electrodes of cathode and anode.

TECHNICAL BACKGROUND

Generally, each organic EL element forming a display panel using organic materials has a configuration where an anode as a transparent electrode, plural organic material layers including a luminescence layer, and a cathode formed of a metal electrode are sequentially laminated as thin films.

Beside the luminescence layer, the organic material layers include a layer such as a hole injection layer and a hole transport layer that are made of materials capable of transporting holes and are provided on the anode side of the luminescence layer, and a layer such as an electron transport layer and an electron injection layer that are made of materials capable of transporting electrons and are provided on a cathode side of the luminescence layer. Organic EL elements having configurations where these layers are combined in various manners have been proposed.

When an electric filed is applied to the organic EL element that has an organic material layer formed of a stacked layer body including the luminescence layer, the electron transport layer, and the electron hole transport layer, electron holes are injected from the anode and electrons are injected from the cathode. The organic EL element uses the luminescence that is emitted when these electrons and electron holes recombine in the luminescence layer, exciton is formed, and it is returned to the ground state. Sometimes the luminescence layer is doped with luminescence pigment as a guest material in order to improve luminescence efficiency and stably drive elements.

Recently, using phosphorescence material for the luminescence layer has been proposed besides fluorescence material. Based on statistics in terms of quantity physiochemistry, in the luminescence layer of the organic EL element the occurrence probability of singlet exciton and triplet exciton after recombination of the electron and the electron hole is considered 1:3. For this reason, based on comparative between fluorescence that emits luminescence by returning direct from the singlet state to the ground state and phosphorescence that emits luminescence by returning from the triplet state to the ground states, employing the phosphorescence is expected more to improve luminescence efficiency. The element employing phosphorescence due to the triplet exciton is expected to achieve luminescence efficiency of four times maximum of the element employing fluorescence due to the singlet exciton. As phosphorescence material, heavy-metalic complex such as platinum and iridium are cited and it is proposed that phosphorescence emission is possible at the room temperature due to heavy element effect.

These organic EL elements are expected as light sources and displays, and practical application is in the process of start at present. These organic EL elements have been variously improved to elongate drive life, increase luminescence, and decrease driving voltage.

For example, Patent Document 1 described below reports on an organic EL element that laminates an anode, a luminescence layer including a phosphorescence iridium complex material, an electron transport layer formed of organic compound, and a cathode to elongate drive life.

Patent Document 1: Japanese Unexamined Patent Publication No.

DISCLOSURE OF THE INVENTION

Problem to be Solved by the Invention

However, it is a major problem to elongate drive life of the organic EL element and further longer drive life is desired.

The present invention is made in view of the above-described problem and it is major object to provide an organic EL element having longer drive life.

Means for Solving Problem

The invention described in claim 1 is an organic EL element 1 includes, with respect of between a pair of electrodes of anode and cathode, a luminescence layer, a hole transport layer provided on the anode side of the luminescence layer, and an electron transport layer provided on the cathode side of the luminescence layer, and the luminescence layer (film thickness=dM; 5 nm to 3000 nm) contains a luminescence pigment and a host material, a first oxidation potential (ED+) of the luminescence pigment is lower than a first oxidation potential (EH+) of the host material, and a first reduction potential (EO−) of the luminescence pigment is lower than a first reduction potential (EH−) of the host material, and a relation between film thickness (film thickness=dE; 5 nm to 3000 nm) of the electron transport layer and film thickness (film thickness=dH; 5 nm to 3000 nm) of the hole transport layer is dH≤dE.

DESCRIPTION OF THE REFERENCE NUMERALS

Figure 1:
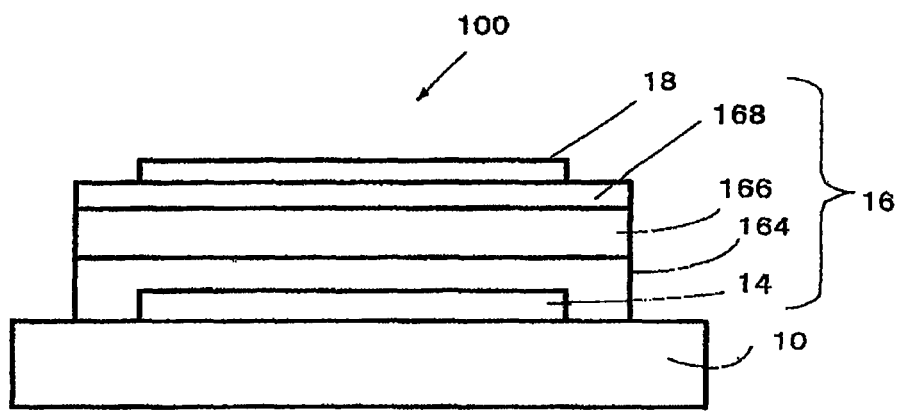
[FIG. 1] A cross-sectional diagram showing an organic EL element of the present exemplary embodiment.

10 Substrate
14 Anode
16 Organic material layer
18 Cathode
100, 200 Organic EL element

THE BEST MODE FOR CARRYING OUT THE CLAIMED INVENTION

Inventors of the present invention consider the organic EL element including a luminescence layer and a hole transport layer provided on the anode side of the luminescence layer, an electron transport layer provided on the cathode side of the luminescence layer, with respect of between a pair of electrodes of cathode and anode, wherein the luminescence layer (film thickness=dM: 5 nm to 300 nm) includes luminescence pigment and host material, a first oxidation potential (ED+) of the luminescence pigment is lower than a first oxidation potential (EH+) of the host material, and a first reduction potential (ED−) of the luminescence pigment is lower than a first reduction potential (EH−) of the host material.

The first oxidation potential (ED+) of the luminescence pigment is lower than the first oxidation potential (EH+) of the host material and the first reduction potential (ED−) of the luminescence pigment is lower than the first reduction potential (EH−) of the host material. Therefore, in the luminescence layer, holes mainly transported by the host material are smoothly captured by the luminescence pigment in the electrically neutral state and the luminescence pigment in the cation state efficiently generates. There occurs condition where electrons transmitted by the host material are supplied. That is, the luminescence pigment does not become in the anion state because the neutral state is not subject to reduction. And the host material is not required to accumulate positive charge on the host molecule unnecessarily and can carry electrons on the empty molecule orbit that is in lower energy level as well. Therefore, deterioration due to reduction of the luminescence pigment and deterioration due to oxidation or reduction of the host material can be prevented.

Thus, as a result of earnest consideration on film thickness of the hole transport layer (HTL) and the electron transport layer (ETL) to prevent deterioration due to oxidation or reduction of the organic luminescence layer and improve drive life of the organic EL element, it is found that drive life of the organic EL element changes depending on the film thickness of the hole transport layer (HTL) and the electron transport layer (ETL).

Further a relation of relative film thickness to this film thickness of the hole transport layer (HTL) and the electron transport layer (ETL) is considered. As a result, with respect to the above-described organic EL element, it is found that drive life can be elongated in the case that a relation between film thickness of electron transport layer (film thickness=dE: 5 nm to 3000 nm) and film thickness of hole transport layer (film thickness=dH; 5 nm to 3000 nm) is dH≤dE.

Hereinafter, an exemplary embodiment of the present invention is described based on drawings. This exemplary embodiment is only one mode to practice and the present invention is not restricted by this embodiment.

As shown in FIG. 1, an organic EL element 100 of this exemplary embodiment has configuration where at least an anode 14, an organic material layer 16, and a cathode 18 are laminated on a transparent substrate 10 formed of glass and the like. Here the organic material layer 16 is obtained by the configuration where ahole transport layer 164 of organic compound, a luminescence layer 166 of organic compound, and an electron transport layer 168 of organic compound are laminated. Film thickness of the organic material layer 16 is preferably 30 nm to 1000 nm.

In the organic EL element 100 of this exemplary embodiment, the luminescence layer 166 includes a host material and a luminescence pigment, it has a relation where a first oxidation potential (ED+) of the luminescence pigment is lower than a first oxidation potential (EH+) of the host material and a first reduction potential (ED−) of the luminescence pigment is lower than a first reduction potential (EH−) of the host material, and a relation between film thickness (dE) of the electron transport layer 168 and film thickness (dH) of the hole transport layer 164 is dH≤dE.

In this exemplary embodiment, although in the organic material layer 16, the configuration of hole transport layer 164/luminescence layer 166/electron transport layer 168 is exemplified, it is not limited to this embodiment. The organic material layer 16 is available as long as it includes at least hole transport layer 164/luminescence layer 166/electron transport layer 168. For example, an electron injection layer made of alkali metal compounds such as LiF may be formed between the electron transport layer 168 and the cathode 18. Further a hole injection layer made of porphyrin compound such as copper phthalocyanine (CuPc) and triarylamine compound may be laminated and formed as a thin film between the anode 14 and the hole transport layer 164. Furthermore, the electron hole injection layer may include electron acceptor and its film thickness (dB) is preferably 5 nm to 3000 nm.

With respect to the electron acceptable compound, it is preferable to have oxidability and capability of accepting an electron from the hole transport compound such as triarylamine compound. Specifically, electron affinity of not less than 4 eV is preferable and electron affinity of not less than 5 eV is more preferable.

Cited as example are onium salt substituted with organic group such as 4-isopropyl-4'-methyldiphenyliodonium Tetrakis(pentafluorophenyl)borate, iron chloride (III) (Japanese unexamined Patent Publication JP-A-11-251067), high-valent inorganic compounds such as ammonium peroxodisulfate, cyano compounds such as tetracyanoethylene, aromatic boron compounds such as tris(pentafluorophenyl)borane (Japanese Unexamined Patent Publication No. JP-A-2003-31365), fullerene derivative, and iodine.

Among the above-described compounds, onium salt substituted with organic group and high-valent inorganic compound are preferable in terms of high oxidability, and onium salt substituted with organic group, cyano compound, and aromatic boron compound are preferable in terms of applicability to wet coating because they are soluble in variety of solvents.

For the cathode 18, used may be, for example aluminum, magnesium, indium, silver, or alloys thereof that are formed of metals of low work function and have thickness of approximately 10 nm to 500 nm. However, materials are not limited to these and may be appropriately selected.

For the anode 14, used may be indium tin oxide (hereinafter referred to as ITO) and the like that are formed of conductive materials of high work function and have thickness of approximately 10 nm to 500 nm, or gold that has thickness of approximately 10 nm to 150 nm. However, materials are not limited to these and may be appropriately selected. In the case that gold is used as electrode material, an electrode becomes translucent in the thin film. As for the cathode 18 and the anode 14, at least one of those may be transparent or translucent.

The hole transport layer 164 is provided between the anode 14 (the hole injection layer if the hole injection layer is provided) and the luminescence layer 166, it is a layer to accelerate transport of holes, and has a function to appropriately transport holes to the luminescence layer 166. Film thickness dH of the hole transport layer 164 is 5 nm to 3000 nm and a relation with film thickness dE of the electron transport layer 168 is required to set to dH≤dE. Preferably film thickness dH of the hole transport layer 164 and/or film thickness dE of the electron transport layer 168 is 5 nm to 500 nm.

Further, a relation between film thickness dH of the hole transport layer 164 and film thickness dM of the luminescence layer 166 is preferably set to dH≤dM. And the hole transport layer 164 may be formed of plural layers. In this case, a relation between layer number (NH; 1 to 3) of the hole transport layer 164 and layer number (NE; integral number of 1 to 3) of the electron transport layer 168 is preferably set to NH≤NE.

As for material of the hole transport layer 164, the material including triarylamine compound is preferable. The material may be appropriately selected in such manner that ion energy is located between the hole injection layer and luminescence layer. For example, NPB (Chemical formula 1) may be employed.

[Chemical Formula 1]

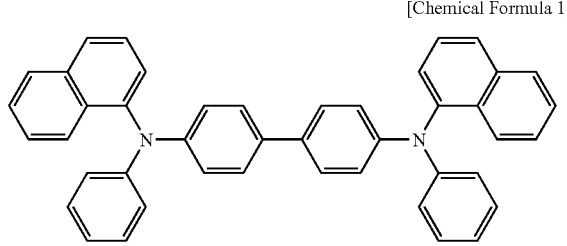

The luminescence layer 166 is a fluorescence emission layer and/or phosphorescence emission layer that recombine the transported holes and the transported electrons as well. The luminescence layer has film thickness dM of 5 nm to 3000 nm and contains the luminescence pigment and the host material.

The luminescence pigment and the host material may be appropriately selected so as to satisfy the characteristics, as long as the first oxidation potential (ED+) of the luminescence pigment is lower than the first oxidation potential (EH+) and the first reduction potential (ED−) of the luminescence pigment is lower than the first reduction potential (EH−) of the host material. For the luminescence pigment, the organic metal complex represented by the formula (Chemical formula 2) described below is preferable, and for example, Ir(ppy)3 (Chemical formula 3) may be employed.

[Chemical formula 2]

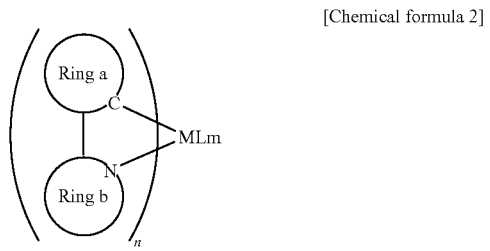

In the formula, M represents metal and m+n represents valence number of the metal. As for metal, cited are ruthenium, rhodium, palladium, silver, rhenium, osmium, iridium, platinum, and gold. m is an integral number of not less than 0 and n is an integral number of not less than 1. L represents monovalent bidentate ligand. Ring a and ring b represent aromatic hydrocarbon group that may have substitutional group.

[Chemcial formula 3]

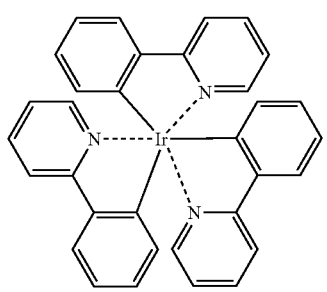

For the host material, at least one type compound of carbazole compound and pyridine compound is preferably employed. Or both carbazole compound and pyridine compound may be employed. For the host material, a compound that has carbazole group and pyridine ring in the same molecule as shown below in the formula (Chemical formulas 4 to 6) is preferable.

[Chemical formula 4]

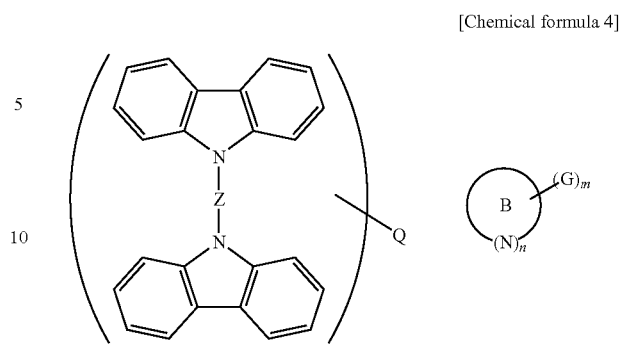

(Z represents direct binding, or voluntary connection group capable of conjugating nitrogen atoms with each other of the carbazole ring.

Q represents direct binding linked to G.

B represents an aromatic heterocyclic ring of six-membered ring having n pieces of N atoms as hetero atom.

n represents an integral number of 1 to 3.

G binds with C atom in the ortho position or para position of N atom of ring B.

G represents direct binding or voluntary connection group to link with Q in the case of linkage with Q.

G represents aromatic hydrocarbon group in the case of no linkage with Q.

m is an integral number of 3 to 5.

Plural pieces of G existing in a molecule may be same or not same.

Ring B may have substitutional group except for G.)

[Chemical formula 5]

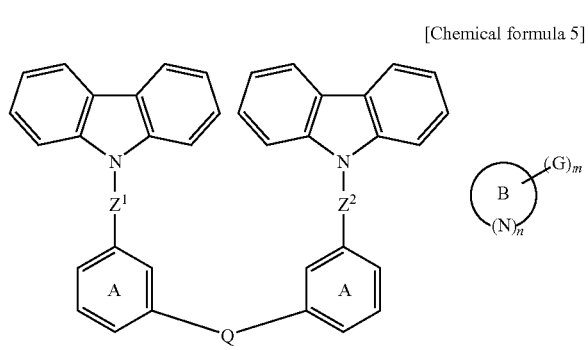

($Z^1$ and $Z^2$ represent direct binding or voluntary connection group.

$Z^1$, $Z^2$ and ring A may have substitutional group.

$Z^1$ and $Z^2$ may be same or not same.

Q represents direct binding with G.

B is aromatic heterocyclic ring of six-membered ring having n pieces of N atoms as hetero atom.

G binds with C atom in the ortho position or para position of N atom of the ring B.

G represents direct binding with Q or voluntary connection group in the case of linkage with Q.

G represents aromatic hydrocarbon group in the case of no linkage with Q.

m is an integral number of 3 to 5.

Plural pieces of G existing in a molecule may be same or not same.

Ring B may have substitutional group except for G.)

[Chemical formula 6]

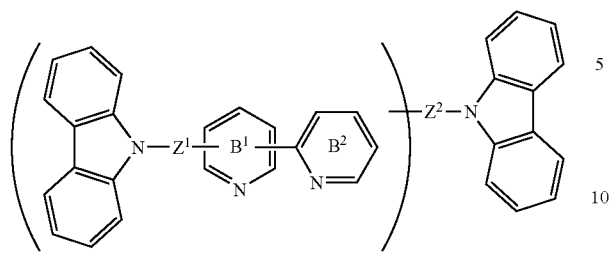

($Z^1$ and $Z^2$ represent direct binding or voluntary connection group. $Z^1$ and $Z^2$ may be same or not same.

Ring $B^1$ and ring $B^2$ are pyridine rings.

$Z^1$, $Z^2$, ring $B^1$ and ring $B^2$ may have substitutional group.)

Specifically the below-described compounds are cited.

[Chemical formula 7]

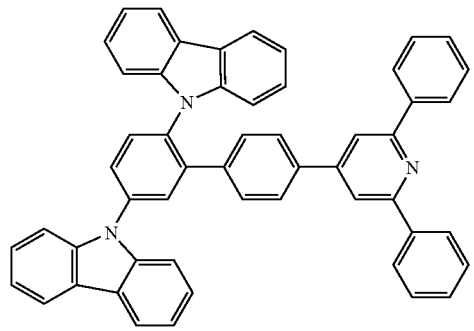

[Chemical formula 8]

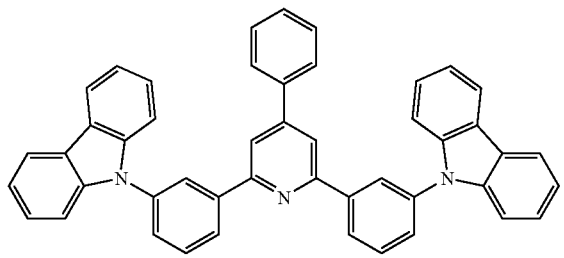

[Chemical formula 9]

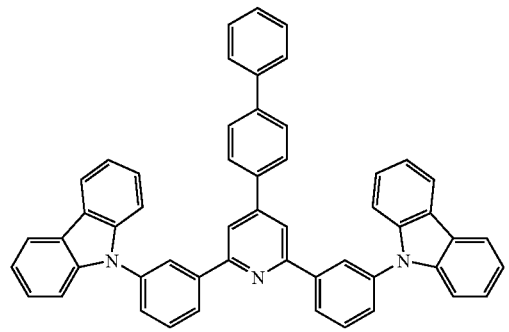

[Chemical formula 10]

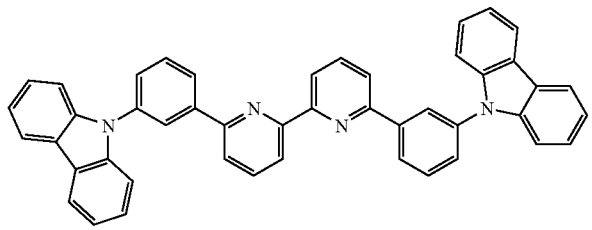

[Chemical formula 11]

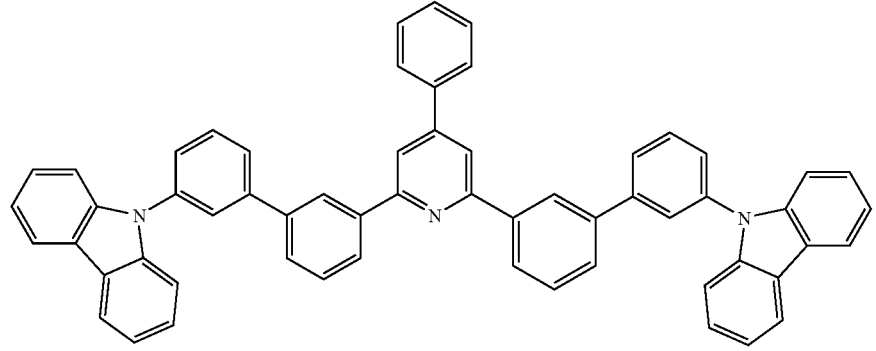

[Chemical formula 12]

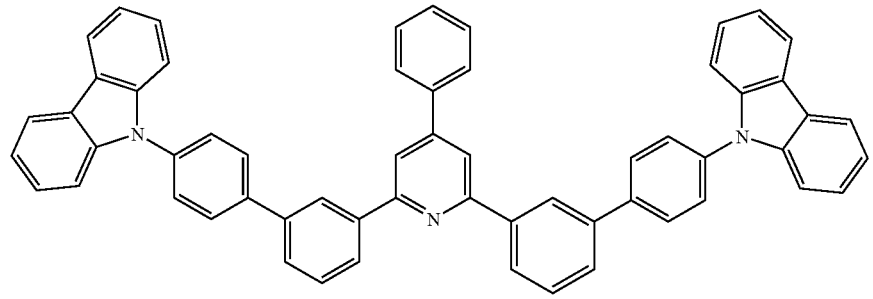

The electron transport layer 168 is provided between the cathode 18 (the electron injection layer in the case that the electron injection layer is provided) and the luminescence layer 166, it is a layer to accelerate transport of electrons, and has a function to appropriately transport electron to the luminescence layer 166. Film thickness dE of the transport layer 168 is 5 nm to 3000 nm and a relation with film thickness dH of the hole transport layer 164 is required to set to dH≤dE. Further the electron transport layer 168 is not limited to a single layer and may be formed of plural layers. In the case of plural layers, the electron transport layer adjacent to the luminescence layer 166 is formed as a first electron transport layer and the first electron transport layer is made of electron transport material of wide-band-gap that has higher first oxidation potential than the other constituent electron transport layers so that confinement of excitons generated in the luminescence layer to the luminescence layer is accelerated to improve efficiency in some cases. A relation between the total number (NE; 1 to 3) of the electron transport layer and the total number (NH; 1 to 3) of the hole transport layer is preferably set to NH≤NE.

In the case that the hole transport layer and/or electron transport layer are formed of plural layers, the film thickness is referred to as that of plural layers in total.

As for material of the electron transport layer 168, materials including organo aluminum complex compound is preferable. For example, $Alq_3$ (Chemical formula 13), BAlq (Chemical formula 14) may be employed but materials are not limited to these.

[Chemcial formula 13]

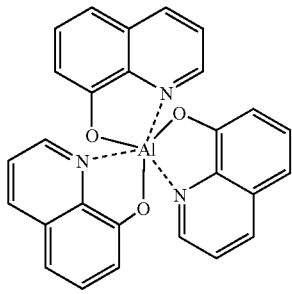

[Chemcial formula 14]

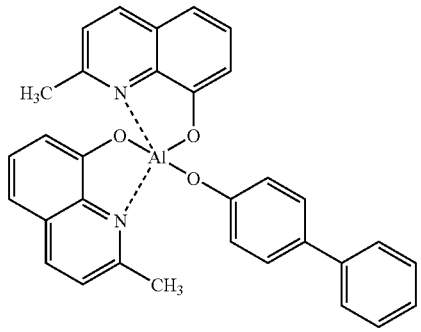

The first oxidation potential (ED+) of the luminescence pigment, the first oxidation potential (EH+) of the host material, the first reduction potential (ED−) of the luminescence pigment, the first reduction potential (EH−) of the host material, and oxidoreduction potential of materials of the electron transport layer can be obtained by electrochemical measurement.

An electrochemical measurement method is explained. Approximately 0.1 to 2 mM of a subject to be measured is dissolved in the organic solvent that contains approximately 0.1 mol/l of tetrabutylammonium perchlorate, tetrabutylammonium hexafluorophosphate, etc. as supporting electrolyte, and the subject to be measured is oxidized-reduced at a work electrode using a glassy carbon electrode as a work electrode, a platinum electrode as a electrode couple, and a silver electrode as a reference electrode. And the oxidoreduction potential of the subject to be measured is calculated by comparing those potentials with oxidoreduction potential of reference substances such as ferrocene. A cyclic voltammetry method is cited as the electrochemical measurement method.

As an example, Ir(ppy)3, compounds of Chemical formulas 4 to 9, oxidoreduction potential of $Alq_3$ and BAlq that are measured by the above method are listed on Table 1.

[Table 1]

TABLE 1

| | Oxidoreduction potential of respective compound | |
|---|---|---|
| Compound | First oxidation potential V vs SCE | First reduction potential V vs SCE |
| Ir(ppy)3 | 0.72 | −2.30 |
| Chemical formula 7 | 1.33 | −2.03 |
| Chemical formula 8 | 1.26 | −2.02 |
| Chemical formula 9 | 1.24 | −1.95 |
| Chemical formula 10 | 1.29 | −2.05 |
| Chemical formula 11 | 1.30 | −2.09 |
| Chemical formula 12 | 1.26 | −2.08 |
| $Alq_3$ | 0.91 | −1.89 |
| BAlq | 1.02 | −1.97 |

EMBODIMENT

Specifically plural samples of organic EL elements are prepared and operation lifetime is evaluated. In the samples, the following materials are sequentially evaporated on ITO (film thickness of 110 nm) anode on respective substrate to produce the organic EL element 200 of the below-described configuration.

Figure 2:
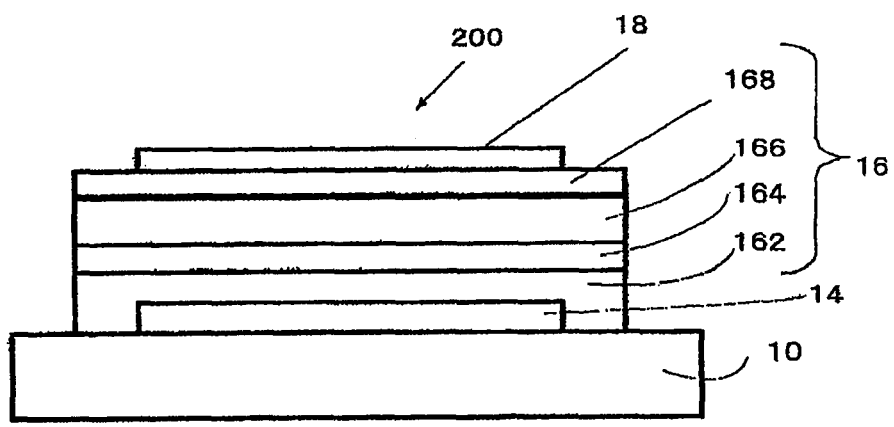
[FIG. 2] A cross-sectional diagram showing an organic EL element of the present example.

The organic layers are laminated as shown in FIG. 2 by using copper phthalocyanine (CuPu) (film thickness of 20 nm respectively) for the hole injection layer 162, NPB for the hole transport layer 164, the compound of Chemical formula 7 of host material that is added with 6 wt % of Ir (ppy) 3 represented in Chemical formula 3 for the luminescence layer 166 as the luminescence pigment, and Alq3 for the electron transport layer 168. Here respective film thickness of the hole transport layer, luminescence layer, and electron transport layer is varied respectively as shown in Table 2.

An element sample 1 is an example of the present invention and an element sample 2 is a comparative example. LiF is further evaporated at film thickness of 1 nm on respective electron transport layer as an electron injection layer, aluminum (Al) of 100 nm film thick is further laminated thereon as cathode to produce the organic EL element.

The above-described element samples are continuously driven at current density of 2.5 mA/cm² and time for decreasing the luminescence by 20% immediately after the initial measurement is measured. The time for decreasing the luminescence of the element sample 2 (comparative example) by 20% immediately after the initial measurement is represented by 1 and a measurement result is expressed in Table 2 together with film thickness of the hole transport layer/luminescence layer/electron transport layer forming the organic material layer.
[Table 2]

TABLE 2

Film thickness configuration of element sample and continuous drive test result

| Element | Film thickness (nm) | | | Time for decreasing luminescence by 20% (relative value) |
|---|---|---|---|---|
| | Hole transport layer | Luminescence layer | Electron transport layer | |
| Sample 1 (example) | 20 | 40 | 40 | 2.2 |
| Sample 2 (comparative example) | 40 | 40 | 20 | 1 |

Table 2 shows that drive life is improved in the element sample 1 of the example.

In the other example, compound of Chemical formula 8 is used instead of the compound of Chemical formula 7 as the host material of the luminescence layer, and prepared are element samples 3, 4, 5, 6 and 7 that are same as the above-described example but film thickness set as in Table 3. Element samples 3, 4, and 5 are examples of the present invention and element samples 6 and 7 are comparative examples.

The above-described element samples are continuously driven at current density of 2.5 mA/cm$^2$, and time for decreasing the luminescence by 20% immediately after the initial measurement is measured. The time for decreasing the luminescence of the element sample 6 (comparative example) by 20% immediately after the initial measurement is represented by 1 and a measurement result is expressed in Table 3 together with film thickness of the hole transport layer/luminescence layer/electron transport layer forming the organic material layer.
[Table 3]

TABLE 3

Film thickness configuration of element sample and continuous drive test result

| Element | Film thickness (nm) | | | Time for decreasing luminescence by 20% (relative value) |
|---|---|---|---|---|
| | Hole transport layer | Luminescence layer | Electron transport layer | |
| Sample 3 (example) | 20 | 40 | 40 | 2.8 |
| Sample 4 (example) | 20 | 40 | 20 | 1.8 |
| Sample 5 (example) | 40 | 40 | 40 | 1.6 |
| Sample 6 (comparative example) | 40 | 40 | 20 | 1 |
| Sample 7 (comparative example) | 40 | 30 | 20 | 1 |

The table 3 shows that the drive life is improved in element samples 3, 4, and 5 of the example compared with element samples 6 and 7 of the comparative example.

In the other example, prepared is element sample 8 of the present example that is same as the above-described example but the electron transport layer formed of double layers. BAlq is used for the first electron transport layer adjacent to the luminescence layer 166 and Alq$_3$ is used for the second electron transport layer that is disposed between the first electron transport layer and the electron injection layer.

The above-described element sample is continuously driven at current density of 2.5 mA/cm$^2$ and time for decreasing the luminescence by 20% immediately after the initial measurement is measured. The time for decreasing the luminescence of the element sample 7 (comparative example) by 20% immediately after the initial measurement is represented by 1 and a measurement result is expressed in Table 4 together with film thickness of the hole transport layer/luminescence layer/electron transport layer (the first electron transport layer and the second electron transport layer) forming the organic material layer.
[Table 4]

TABLE 4

Film thickness configuration of element sample and continuous drive test result

| Element | Film thickness (nm) | | | | Time for decreasing luminescence by 20% (relative value) |
|---|---|---|---|---|---|
| | Hole transport layer | Luminescence layer | First electron transport layer | Second electron transport layer | |
| Sample 8 (example) | 20 | 30 | 10 | 40 | 2.3 |
| Sample 7 (comparative example) | 40 | 30 | 0 | 20 | 1 |

Table 4 shows that drive life of the element sample 8 of the example is improved compared with the element sample 7 of the comparative example.

Further in the other example, used as the electron injection layer is polyether containing aromatic diamine (weight-average molecular weight of 26,900) (film thickness of 30 nm) that is added with 17 weight % of aromatic boron compound salt that is an electron acceptor and represented by Chemical formula 16 instead of copper phthalocyanine. And NPB is used for the hole transport layer, the compound of Chemical formula 9 of host material that is added with 6 wt % of Ir(ppy)3 is used for the luminescence layer as the luminescence pigment, and Alq$_3$ is used for the electron transport layer to prepare element samples 9 and 10 whose film thickness is set as shown in Table 4. The element sample 9 is an example of the present invention and the element sample 10 is a comparative example.

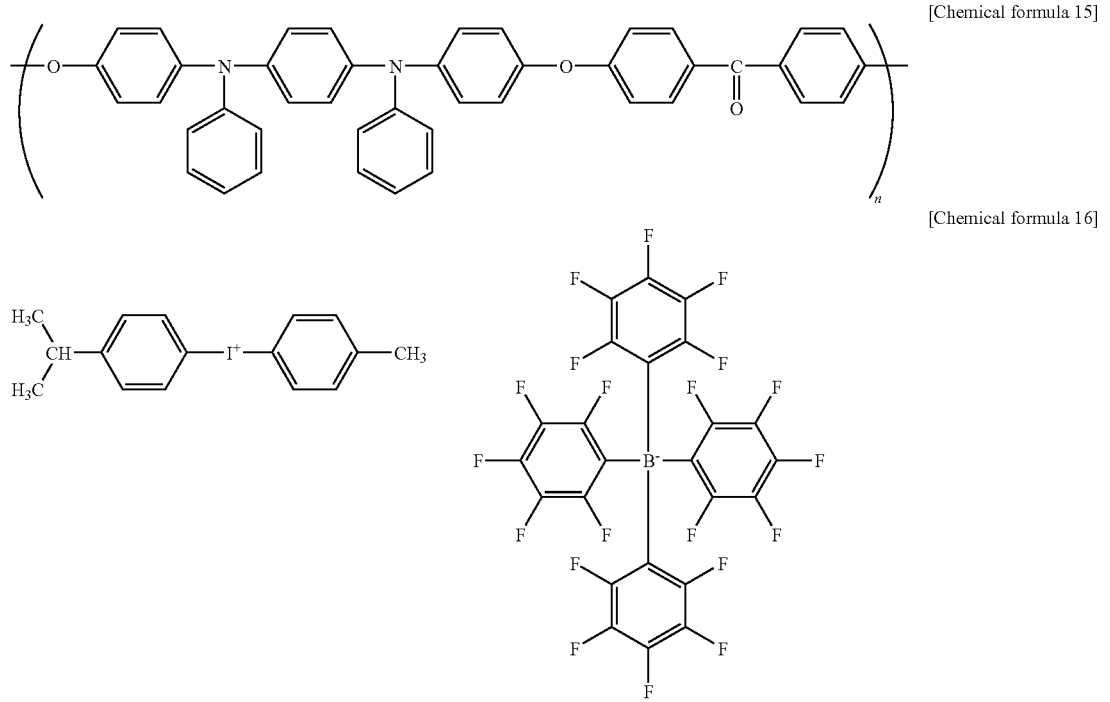

[Chemical formula 15]

[Chemical formula 16]

The hole injection layer is formed by spin-coating on ITO anode a coating solution where 2 wt % of the polyether containing aromatic diamine and 0.4 wt % of the electron acceptorare dissolved in ethyl benzoate.

The above-described element samples are continuously driven at current density of 7 mA/cm$^2$ and time for decreasing the luminescence by 20% immediately after the initial measurement is measured. The time for decreasing the luminescence of the element sample 10 (comparative example) by 20% immediately after the initial measurement is represented by 1 and a measurement result is expressed in Table 5 together with film thickness of the hole transport layer/luminescence layer/electron transport layer forming the organic material layer.

Table 5 shows that drive life of the element sample 10 of the example is improved compared with the element sample 9 of the comparative example.

[Table 5]

TABLE 5

Film thickness configuration of element sample and continuous drive test result

| Element | Film thickness (nm) | | | Time for decreasing luminescence by 20% (relative value) |
|---|---|---|---|---|
| | Hole transport layer | Luminescence layer | Electron transport layer | |
| Sample 9 (example) | 20 | 40 | 40 | 1.2 |
| Sample 10 (comparative example) | 40 | 40 | 20 | 1 |

Thus, according to these examples, an organic EL element having long drive life can be obtained.

What is claimed is:

1. An organic electroluminescence element comprising with respect to the layers between a pair of electrodes of anode and cathode;

a luminescence layer;

a hole transport layer provided on an anode side of the luminescence layer, the hole transport layer having a hole transport layer thickness ("dH") of 5 nm to 3000 nm and comprising a plurality of layers; and an electron transport layer provided on a cathode side of the luminescence layer, the electron transport layer having an electron transport layer thickness ("dE") of 5 nm to 3000 nm and comprising a plurality of layers, wherein the luminescence layer has a thickness of 5 nm to 3000 nm and contains a luminescence pigment and a host material, the luminescence pigment containing an organo-metalic complex compound, a first oxidation potential ("ED+") of the luminescence pigment is lower than a first oxidation potential ("EH+") of the host material, and a first reduction potential ("ED−") of the luminescence pigment is lower than a first reduction potential ("EH−") of the host material, a relation between dE and dH is dH≤dE, a relation between a total number of layers of the hole transport layer ("NH") and a total number of layers of the electron transport layer ("NE") is set to NH≤NE, and a first layer adjacent to the luminescence layer of the electron transport layer comprises an electron transport material and the electron transport material has a wide band gap and a first oxidation potential greater than an electron transport material of another layer of the electron transport layer, wherein the organo-metalic complex compound is a compound represented by the following formula (Chemical formula 2):

[Chemical formula 2]

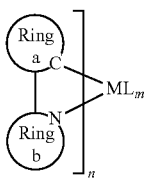

in the formula, M represents metal and m+n represents valence number of the metal, and the metal is selected from the group consisting of ruthenium, rhodium, palladium, silver, rhenium, osmium, iridium, platinum, and gold, m is an integral number of not less than 0, and n is an integral number of not less than 1, L represents monovalent bidentate ligand, and ring a and ring b represent aromatic hydrocarbon group that may have substitutional group, and wherein the host material is a compound represented by any one of the following formulas (Chemical formulas 9 to 12):

[Chemical formula 9]

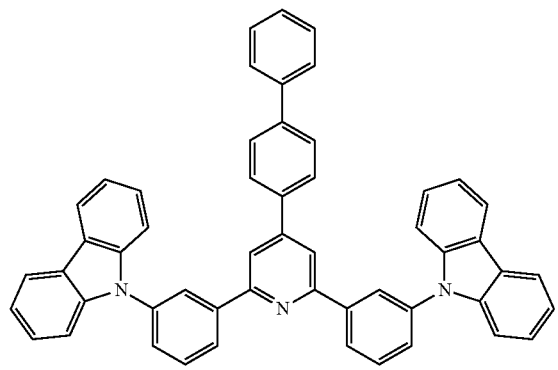

[Chemical formula 10]

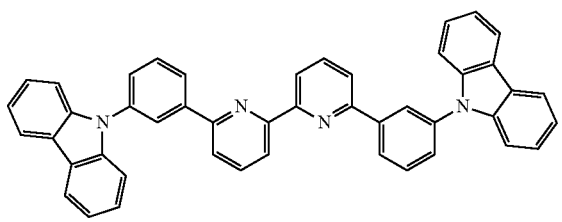

[Chemical formula 11]

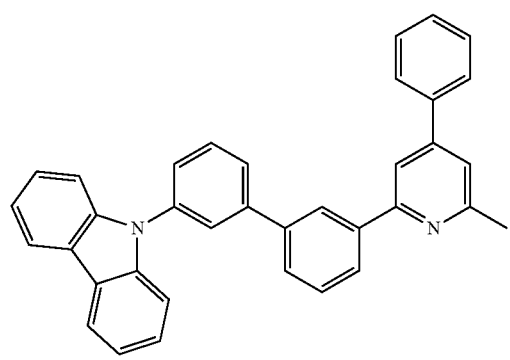

-continued

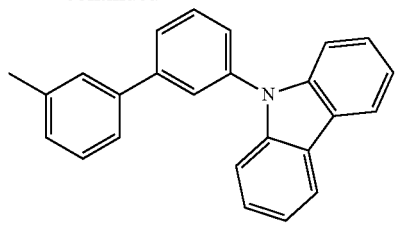

[Chemical formula 12]

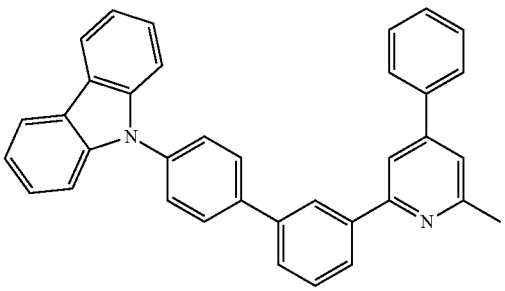

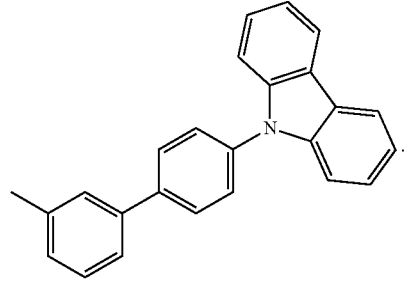

2. The organic electroluminescence element according to claim 1,
    wherein a hole injection layer is provided between the anode and the hole transport layer.

3. The organic electroluminescence element according to claim 2,
    wherein the hole injection layer includes an electron acceptor and film thickness ("dB") thereof is 5 nm to 3000 nm.

4. The organic electroluminescence element according to claim 1,
    wherein the organo-metalic complex compound is Ir (ppy) 3 represented by the following Chemical formula 3:

[Chemical formula 3]

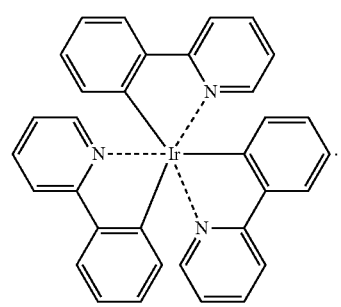

* * * * *